US006841201B2

(12) United States Patent
Shanov et al.

(10) Patent No.: US 6,841,201 B2
(45) Date of Patent: Jan. 11, 2005

(54) APPARATUS AND METHOD FOR TREATING A WORKPIECE USING PLASMA GENERATED FROM MICROWAVE RADIATION

(75) Inventors: Vesselin Nikolov Shanov, Cincinnati, OH (US); Saswati Datta, Cincinnati, OH (US); Seved Farhad Miralai, Fairfield, OH (US); John Andrew McDaniel, Middletown, OH (US)

(73) Assignee: The Procter & Gamble Company, Cincinnati, OH (US)

( * ) Notice: Subject to any disclaimer, the term of this patent is extended or adjusted under 35 U.S.C. 154(b) by 403 days.

(21) Appl. No.: 10/027,616

(22) Filed: Dec. 21, 2001

(65) Prior Publication Data

US 2003/0136518 A1 Jul. 24, 2003

(51) Int. Cl.[7] .............................. B05D 3/06; H05H 1/46; C08J 2/46; C08F 7/18
(52) U.S. Cl. ........................ 427/562; 427/488; 427/491; 427/575; 216/69
(58) Field of Search ................................ 427/488, 489, 427/490, 491, 562, 569, 575; 216/69, 70

(56) References Cited

U.S. PATENT DOCUMENTS

| | | | |
|---|---|---|---|
| 4,138,306 A | | 2/1979 | Niwa |
| 4,652,723 A | | 3/1987 | Salinier et al. |
| 5,049,406 A | * | 9/1991 | Geittner et al. |
| 5,084,126 A | | 1/1992 | McKee |
| 5,120,568 A | * | 6/1992 | Schuurmans et al. |
| 5,387,842 A | | 2/1995 | Roth et al. |
| 5,403,453 A | | 4/1995 | Roth et al. |
| 5,423,942 A | | 6/1995 | Robbins et al. |
| 5,549,780 A | | 8/1996 | Koinuma et al. |
| 5,628,883 A | * | 5/1997 | Sugiyama et al. ..... 204/192.32 |
| 5,671,045 A | | 9/1997 | Woskov et al. |
| 5,830,540 A | * | 11/1998 | Bowers ...................... 427/562 |
| 6,005,349 A | | 12/1999 | Kunhardt et al. |
| 6,081,329 A | | 6/2000 | Cohn et al. |
| 6,262,523 B1 | | 7/2001 | Selwyn et al. |
| 6,287,642 B1 | * | 9/2001 | Leutsch et al. ............. 427/536 |
| 6,308,654 B1 | | 10/2001 | Schneider et al. |
| 6,406,759 B1 | * | 6/2002 | Roth ......................... 427/562 |
| 6,613,394 B2 | * | 9/2003 | Kuckertz et al. ........... 427/488 |

FOREIGN PATENT DOCUMENTS

| | | |
|---|---|---|
| EP | 1 162 646 A2 | 12/2001 |
| JP | 1994252051 A | 9/1994 |
| JP | 2001-159074 | 6/2001 |
| JP | 2003514114 A | 4/2003 |
| WO | WO 00/79843 A1 | 12/2000 |
| WO | WO 01/44790 A1 | 6/2001 |
| WO | WO 01/93315 A2 | 12/2001 |
| WO | WO 02/065820 A1 | 8/2002 |
| WO | WO 02/099836 A1 | 12/2002 |

OTHER PUBLICATIONS

JP 05251198, abstract of , by K. Takehisa.
Takaki, et al., "Multipoint Barner Discharge Process for Removal of NOx from Diesel Engine Exhaust", IEEE Transactions on Plasma Science, vol. 29, No. 3, Jun. 2001.
Bayer, et al., "Overall kinetics of $SiO_x$ remote–PECVD using different organosilicon monomers", Surface and Coatings Technolog 116–119 (1999), pp. 874–878, no month.
Karches et al., "A circulating fluidized bed for plasma–enhanced chemical vapor deposition on powders at low tmeperatures", Surface and Coatings Technology 116–119 (1999) pp. 879–885, no month.
ASTEX®, "Downstream Sources for Etch and Deposition," Feb. 1, 1991, Applied Science Technology, Inc., Wobum, Mass.
ASTEX®, "Providing Innovation in Plasma, Power and Reactive Gases," Jan.–Feb. 2001, Applied Science Technology, Inc., Wobum, Mass.
AX7200, Atmospheric Plasma Torch instructions, received May, 2001.
U.S. Appl. No. 10/027,646, filed Dec. 21, 2001, inventor Datta et al.

* cited by examiner

*Primary Examiner*—Marianne Padgett
(74) *Attorney, Agent, or Firm*—Larry L. Huston; Leonard W. Lewis; Steven W. Miller

(57) ABSTRACT

An apparatus and method that generates plasma using a microwave radiation supply. The plasma is used to treat a surface of a workpiece at approximately atmospheric pressure. Plasma excites a working gas to create an excited gaseous species without degradation from undue heat caused by the plasma. The gaseous species exit an outlet of the apparatus to treat the surface of a workpiece when the outlet is juxtaposed with the workpiece.

7 Claims, 2 Drawing Sheets

APPARATUS AND METHOD FOR TREATING A WORKPIECE USING PLASMA GENERATED FROM MICROWAVE RADIATION

FIELD OF THE INVENTION

The present invention relates to an apparatus and method for treating a surface of a workpiece using plasma and more particularly using plasma generated by microwave radiation.

BACKGROUND OF THE INVENTION

Plasmas, such as are described herein, are partially ionized gases and consist of ions, electrons and neutral species. Plasma is state of matter produced by the action of DC or AC fields having RF or MW frequencies. Plasmas can be useful for treating the surface of a workpiece.

Low power density, low intensity plasmas, such as dark discharges and corona discharges, have been used at low pressure and at one atmosphere for the surface treatment of various materials. However, due to the relatively low energy density, these discharges alter surface properties of materials relatively slowly, if at all. Also, corona discharges are non-uniform and filamentary in nature. This may lead to localized arcs known as "hot spots" and non-uniform surface modification. Generally, the use of corona discharges for treating the surface of a workpiece is unsatisfactory.

Glow discharge plasmas are produced by free electrons energized by an imposed DC or RF electric field. This field causes electrons to collide with the neutral species. These collisions form a variety of active species which may include, excited atoms and molecules, metastables, individual atoms, free radicals, molecular fragments, monomers, electrons and ions, as well as ultraviolet and visible photons Glow discharge plasma has been successfully used in low pressure or partial vacuum environments (e.g., below 10 Torr). In many applications, glow discharge provides active species which produce important effects, but generates temperatures high enough or requires treatment times long enough to damage the surface of the workpiece being treated.

The placement of the workpiece relative to the plasma zone is critical. If MW plasma is used and the workpiece is too close, it will be damaged by the heat. If the workpiece is too far away, the active species may recombine before encountering the surface of the workpiece.

Plasma treatments, such as plasma etching, deposition, cleaning or sanitization of a workpiece, can change the surface properties of the workpiece. Plasma etching can remove small amounts of material from the surface, thereby also removing surface contaminants and/or exposing a fresh surface for subsequent processing. Plasma etching can be used for applications such as sterilizing, cleaning, etc. of surfaces of a workpiece. Plasma-cleaned surfaces may provide for adhesion of electroplated layers or paint and stronger adhesive bonding of substances to the surface. Plasma etching may be useful for skin cleaning, hair cleaning, window cleaning, etc. Plasma etched surfaces may have modified moisture uptake properties, useful in applications such as household painting, nail polishes, hair coloring, skin moisturizing, etc.

Plasma deposition can deposit a thin layer or coating on the surface of a workpiece, providing improved surface properties such as hydrophobicity, hydrophilicity, oleophobicity or oleophilicity. Such surface properties may provide stain resistant fabrics, or superabsorbent material on the substrate. Plasma deposited coatings can be used on a variety of workpieces such as shoes, carpets, upholstery, decks, etc.

Glow discharge plasmas are typically generated in low pressure environments. This constraint usually necessitates the treatment of workpieces within a vacuum system. Alternatively, glow discharge plasmas may be generated, for example, using the one atmosphere uniform glow discharge plasma reactors described in U.S. Pat. Nos. 5,387,842 and 5,403,453, both issued to Roth, et al, on Feb. 7, 1995, and Jun. 6, 2000. Most of this work has been performed in a laboratory environment and has been limited to very small scale operations. The workpiece is limited to the size of the chamber. To be able to treat a workpiece of any size, such as a garment, the chamber must be large enough to allow the garment to be disposed within the chamber. Generally, this will require the chamber to be big, bulky and expensive.

When treating workpieces, such as garments, the electrodes used to generate the plasma must be spaced a sufficient distance apart if the garment is to be placed between the electrodes. Even if the electrodes are placed on a common side of the workpiece, the electrodes must be sized to generate a plasma field large enough to react with the entire workpiece. This increased electrode spacing and size constraint creates problems with the generation of uniform plasma.

Furthermore, such a chamber is typically stationary and thus requires the workpiece to be moved and placed within the chamber. This type of system cannot be used with a stationary workpiece.

U.S. Pat. No. 5,671,045 issued to Woskov et al. on Sep. 23, 1997, and U.S. Pat. No. 6,081,329 issued to Cohn et al. on Jun. 27, 2000, disclose atmospheric pressure microwave plasma devices. These devices are used to activate atoms for trace element monitoring and analysis of solid, liquid and gas samples, based on the principles of the atomic emission spectroscopy. The device does not include a process chamber for treating a surface of a work-piece. Furthermore, these references fail to teach deposition/polymerization/etching, or other surface modifications.

Bayer et al. in the journal "*Surface and Coatings Technology*" 116–119 (1999), pp 874–878 reveals a process for plasma deposition of organosilicon monomers using microwave plasma. The monomer is introduced either directly into the plasma or into the remote zone downstream the plasma. The described technique requires low pressure environment to pump the gaseous reaction products out of the reactor and to sustain the plasma. It does not disclose an apparatus or process to plasma treat a workpiece at atmospheric pressure.

A publication in the journal of "*Surface and Coatings Technology*" 116–119 (1999), pp 879–885, by Karches et al., describes a fluidized bed reactor for plasma-enhanced chemical vapor deposition on powder. The plasma is generated in a reactor using microwave radiation. The reaction gas is fed from the bottom side of the reactor. This reactor requires a vacuum unit to sustain the plasma and allow the plasma polymer deposition with microwave radiation.

One system that utilizes microwave radiation to generate plasma at atmospheric pressure is manufactured by MKS/Astex, of Wilmington, Ma. It includes a magnetron head with power supply, Model No. AX2115-2, a circulator, Model No. AX3120, a dummy load, Model No. AX3030, a SMARTMATCH unit including a matching head and detector module, Model No. AX3060, and a plasma applicator with waveguides, Model No. AX7200. The waveguide provides a pathway for the microwave radiation. The plasma applicator includes a quartz tube forming a chamber and having an outlet. However, this system is not designed to treat surfaces. It is not designed to advantageously admit a working gas into its chamber for the treatment of workpieces. In addition, this system does not suggest how to get the working gas into the chamber without destroying the working gas by the plasma. Due to cost and availability, it is desirable to have a plasma-generating apparatus that uses a microwave radiation source to generate the plasma to treat a surface of a workpiece. The present invention provides an approximately atmospheric pressure, microwave source plasma generating apparatus and method to treat a surface of a workpiece. The present invention also provides such an apparatus and method, wherein the apparatus is movable about the workpiece during treatment.

SUMMARY OF THE INVENTION

In one embodiment the present invention comprises an apparatus for treating a surface of a workpiece at approximately atmospheric pressure. The apparatus comprises a chamber for containing a plasma, a first inlet having a first inlet orifice for admitting a plasma gas into the chamber, and a microwave power supply for providing microwave radiation. The microwave radiation generates plasma from the plasma gas. The plasma is centered on a plasma core and has an inner plasma zone adjacent the plasma core and an outer plasma zone adjacent the inner plasma zone. The apparatus further has a second inlet having a second inlet orifice for admitting a working gas into the chamber, wherein the working gas generates excited species. The excited species of the working gas does not have deleterious interaction with or caused by the plasma. The apparatus further has an outlet from the chamber, allowing the excited species to exit the chamber and deposit on the workpiece.

DETAILED DESCRIPTION

Figure 1:
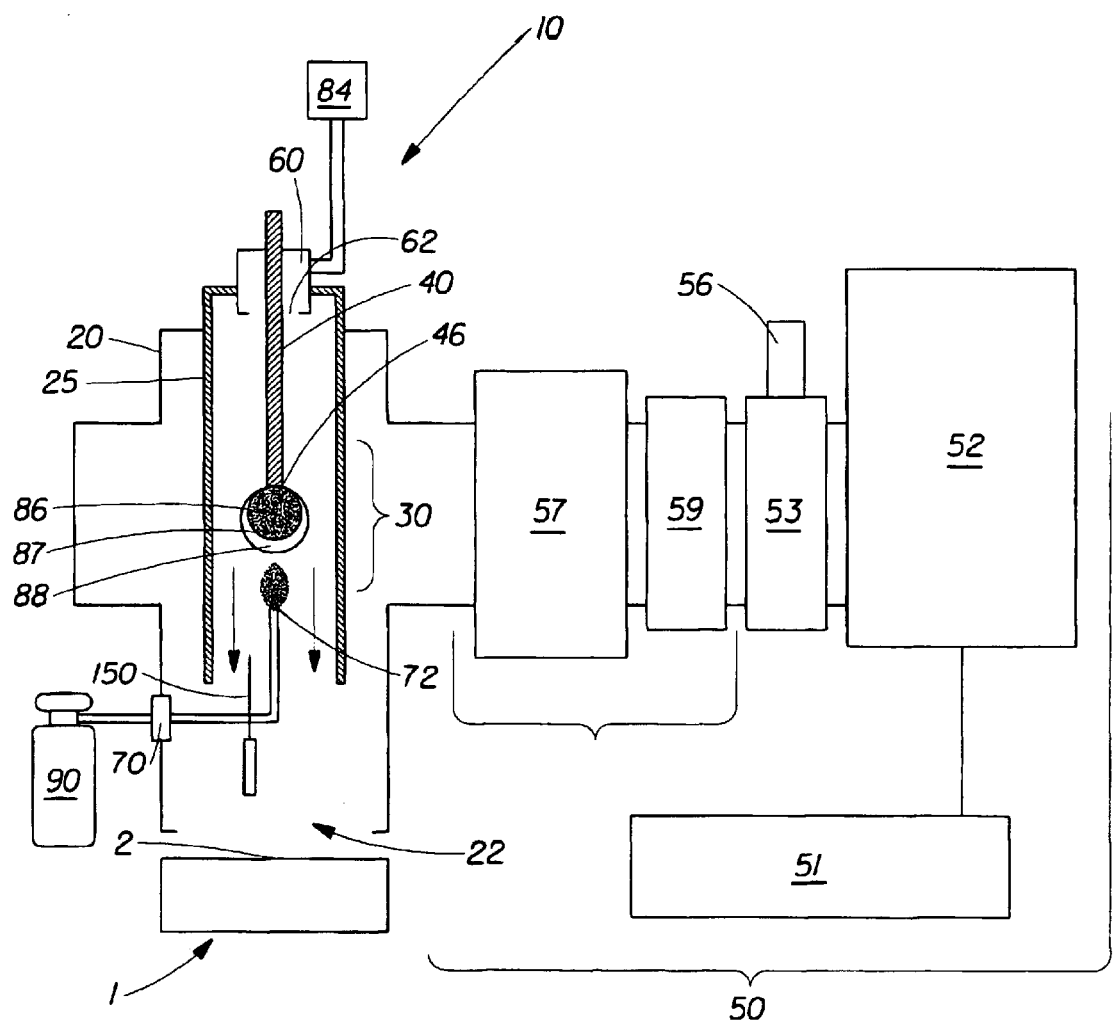
FIG. 1 is a schematic view of an apparatus according to the present invention.
Figure 2:
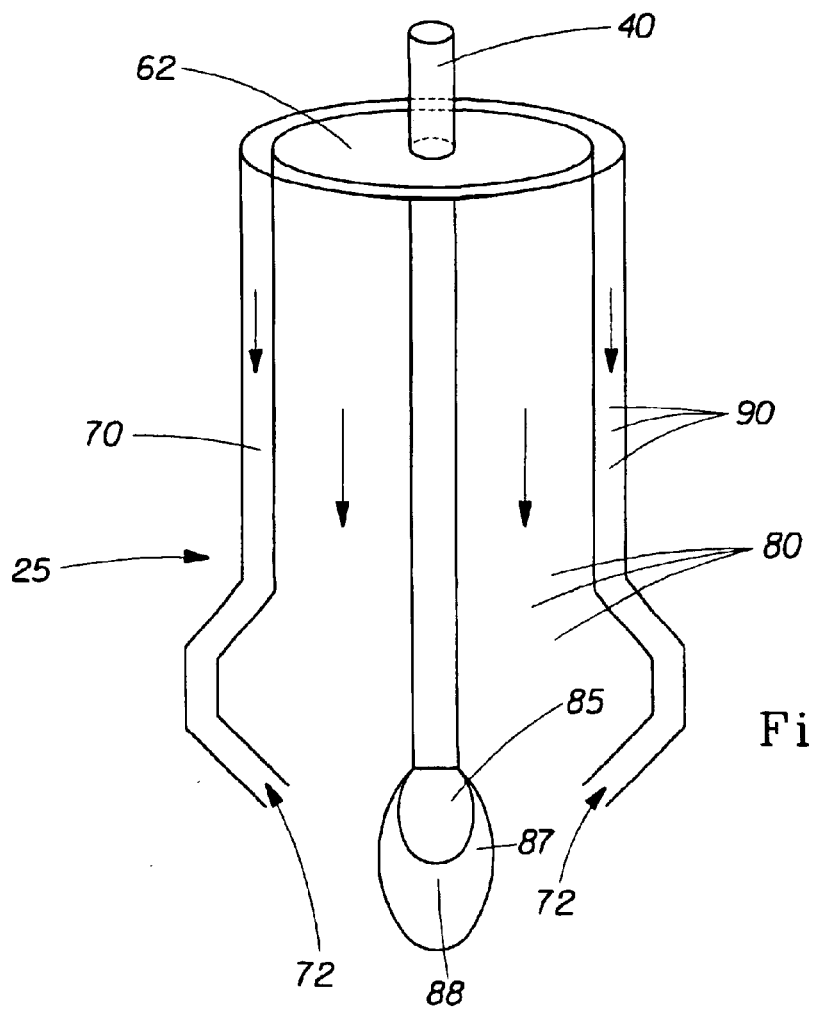
FIG. 2 is a schematic view of an alternative chamber having coaxial first and second inlets.

Referring to FIGS. 1–2, the present invention comprises an apparatus 10 that generates plasma at approximately atmospheric pressure by using a microwave power supply 50. The plasma may be used to treat a surface 2 of a workpiece 1. Apparatus 10 comprises a chamber 20 having an outlet 22, an optional window 30 for admitting microwave radiation into chamber 20, a microwave power supply 50 for producing microwave radiation which is used for generating a plasma from a plasma gas 80, a first inlet 60 for admitting plasma gas 80 into chamber 20 and a second inlet 70 for admitting a working gas 90 into chamber 20. Excited species of the plasma interacts with the working gas 90, creating an excited species in the working gas 90. These excited species from the working gas 90, exits outlet 22 and treats surface 2 of a workpiece 1 when outlet 22 is juxtaposed with workpiece 1. The outlet 22 is considered to be juxtaposed with the workpiece 1 if the outlet 22 contacts or is spaced in relation thereto such that the active species are deposited on the surface 2 and provide functionality. As used herein, an excited species is a reactive particle or an energized particle having more energy than occurs in the ground state.

Chamber 20 may be generally enclosed, to define an interior volume. Chamber 20 may also include an optional window 30 for admitting microwave radiation into chamber 20 if the microwave power supply is external to the tube 25. Preferably, chamber 20 is a quartz or sapphire tube 25, and optionally water-cooled. Due to the transparency to microwave radiation, quartz inherently acts as an integral window 30. However, if chamber 20 is not transparent to microwave radiation then it may include a separate window 30 transparent to microwave radiation. If the microwave power supply 50 is internal to tube 25, a transparent window 30 may not be needed unless an external power supply is also provided.

First inlet 60 is connected to chamber 20 for admitting plasma gas 80 into chamber 20. First inlet 60 includes a first inlet orifice 62 disposed within chamber 20 or on the chamber wall, wherein plasma gas 80 flows through first inlet 60 and exits from first inlet orifice 62 into chamber 20. When plasma gas 80 exits first inlet orifice 62 and is exposed to microwave radiation, plasma is generated at the plasma concentrator.

Plasma comprises a plasma core 86, inner zone 87 and outer zone 88. The plasma core 86 is the hottest and typically most central portion of the plasma zone created in accordance with the present invention. Outboard of and substantially circumscribing the plasma core 86 is an inner plasma zone 87. The inner plasma zone 87 has a lower temperature and typically a greater volume than the plasma core 86. Outboard of and substantially circumscribing the inner plasma zone 87 is an outer plasma zone 88. The outer plasma zone, 88 in turn, has a lower temperature and typically a greater volume than the inner plasma zone 87.

Opposite first inlet orifice 62, first inlet 60 is connected to a plasma gas source 84 which supplies plasma gas 80. Plasma gas source 84 may be internal to chamber 20 or external as shown. The term, "plasma gas source 84", as used herein, refers to and includes the supply line(s), vlave(s) and connection(s) necessary to supply the plasma gas 80 from a gas storage source or container to an inlet 60. Plasma gas 80 can comprise any gas capable of being used to generate plasma, including but not limited to oxygen, etc. Generally, plasma gas 80 comprises an inert gas, such as He, Xe, Ar, or other gases such as $N_2$, or any combination thereof, such as He and Ar.

Plasma gas 80 and/or working gas 90 may have dual functionality. Dual functionality, as used herein, occurs when the plasma gas 80 or working gas 90 is capable of having or performing two or more actions or functions during the treatment process. For example, if plasma gas 80 comprises a blend of He and $O_2$, plasma gas 80 may act as both the plasma gas 80 to generate the plasma and as working gas 90 to treat the surface 2. In this example, the He component acts as the plasma gas 80 to form plasma within chamber 20 and $O_2$ acts as a working gas 90 to treat the surface 2 of workpiece 1. Also, in this example, He acts as a carrier gas. Carrier gas, as used herein, is defined as a gas that transports a working gas 90 to a desired point in the system.

Working gas 90 is a gas that when excited by plasma 88 creates excited gaseous species that exit outlet 22 of chamber 20 and treat surface 2 of workpiece 1. Working gas 90 can be a variety of gases or vapors. Working gas 90 includes but is not limited to oxygen, inert gases, nitrogen, organic or inorganic monomers, hydrocarbons, air, or any combination thereof.

A second inlet 70 is juxtaposed with chamber 20 for supplying and exposing working gas 90 to the plasma. Second inlet 70 includes a second inlet orifice 72. Second inlet 70 allows working gas 90 to bypass first inlet orifice 62 such that contact of working gas 90 with plasma is such that working gas 90 has minimal deterioration due to contact or interaction with plasma. In the plasma core 86 temperatures can exceed 1000° C. Many working gasses 90, if supplied directly into the plasma core 86 or left to dwell within the plasma too long, will deteriorate and thus leave insufficient excited species or even create undesirable excited species to treat surface 2 of workpiece 1.

If desired multiple first or second inlets 60, 70 may be used. The multiple inlets 60, 70 may have a common header with plural first and second inlet orifices 62, 72, each inlet orifice 62, 72 may have a dedicated inlet 60, 70 or a combination thereof. If plural first inlets 60 are used, the apparatus may have an equal or lesser number of plural plasma zones. Each such plasma zone may have a dedicated microwave power supply 50, or a common microwave power supply 50 may be divided between plural first inlets 60, or a combination thereof may be used. This arrangement provides the flexibility that equal or unequal power levels may be provided to the different plasma zones.

Further, as illustrated by the examples below, plasma temperature may vary with the plasma gas 80, applied power, etc. Accordingly, certain working gasses 90 may encounter deleterious effects due to interaction with the inner plasma zone 87 or even the outer plasma zone 88. Thus, based on working gas composition/temperature sensitivity, plasma temperature and residence time with the plasma, the working gas 90 may require different flow rates, inlet orifice 72 positions or other measures to ensure the working gas 90 is excited by, but does not degrade due to or encounter deleterious effects from the plasma temperature. Thus, second inlet 70 may be positioned to allow working gas 90 to bypass first inlet orifice 62 to avoid direct contact with the core 86 of plasma and extended contact with the inner or even outer plasma zones 87, 88. In one preferred embodiment, second inlet 70 supplies working gas 90 downstream from first inlet orifice 62, and even more preferably downstream from the plasma. Second inlet orifice 72 may be disposed downstream from tube 25 or juxtaposed between plasma zone and surface 2. This location of second inlet 70 allows working gas 90 to bypass the first inlet orifice 62 and thus bypass the plasma zone.

Microwave radiation is supplied by microwave power supply 50. Microwave power supply 50 may be any commercially available microwave power generator. Generally, microwave power ranging from 1–1500 W and preferably from 100–500 W, supplied at a frequency of 1–10 GHz, and preferably 2.2–2.7 GHz is suitable. Pressures of 200 to 2500 Torr and preferably approximately atmospheric pressure may be used.

The following description is provided for exemplary purposes only and does not limit the present invention. In one embodiment, microwave power supply 50 comprises a system supplied by MKS/ASTEX of Wilmington, Ma., as detailed in the Background discussion above. Microwave power supply 50 may comprise a power generator 51, magnetron head 52, a circulator 53, detector module 59, tuner 57, dummy load 56 and an optional match unit 55 assembled as would be known to one of ordinary skill. The detector module 59 and tuner 57 may be combined in to a single automatic tuner 55, such as a SMARTMATCH unit.

The chamber 20 may include a plasma concentrator 40. Without being limited by theory, it is believed that plasma concentrator 40 creates more circumferentially and radially uniform plasma within chamber 20. Also, it is believed that plasma concentrator 40 may provide the initial electrons to generate plasma and a surface, preferably refractory, where the plasma concentrates. Plasma concentrator 40 is disposed within chamber 20, and is optionally axi-symmetrical therewith. A space between plasma distributor 40 and chamber walls 26 may create a hydrodynamic flow pattern in the plasma gas 80 that may favor plasma generation at atmospheric pressure.

The plasma concentrator 40 may be a ceramic rod joined to the tube 25 at a proximal end, and extending to a distal end 44 internal to the tube 25. Plasma concentrator 40 is preferably disposed within chamber 20 such that distal end 46 is centered in optional window 30 or otherwise is in the region of microwave transmission.

Apparatus 10 may include an optional igniter 150. Igniter 150 may comprise a dielectric barrier discharge, a readily ionizable gas, a tungsten wire device, or any low-work function metals. Igniter 150 is used for initiating the plasma and/or sustaining it at low power levels. Apparatus 10 may or may not need to use igniter 150 depending upon the type of plasma gas 80 used. When plasma gas 80 has a high breakdown voltage, igniter 150 may be needed. However, if plasma gas 80 has a low breakdown voltage, igniter 150 may not be needed. Generally, it is desirable to not provide an igniter 150, if the apparatus 10 can feasibly operate without one. The igniter 150 is typically quite hot and requires careful placement within the chamber 20.

Referring to FIG. 2, plasma concentrator 40 may have a longitudinal hole or flow channel, optionally annular, therethrough. Working gas 90 may be supplied into the hole of the plasma concentrator 40. Working gas 90 flows through hole and into chamber 20. Preferably, the exit for this hole into chamber 20 is disposed so working gas 90 bypasses first inlet orifice 62 and the core of plasma 86. Plasma concentrator 40 may have two concentric, longitudinal holes therethrough which function as the first and second inlets 60, 70. The plasma gas 80 and working gas 90 flow through their respective inlets 60, 70 so that plasma gas 80 enters chamber 20 through first inlet orifice 62 and working gas 90 enters chamber 20 such that it bypasses first inlet orifice 62. The inlets 60, 70 may be concentric, as shown, or may be or side-by-side. In the concentric inlet 60, 70 geometry, the working gas 90 and plasma gas 80 have a coaxial flow pattern. Either the plasma gas 80 or the working gas 90 may be internal or external to the other. In the illustrated embodiment the working gas 90 is external to, and congruent and coaxial of the plasma gas 80. This arrangement prophetically, provides the benefit of a substantially radially and circumferentially uniform active species generation. If desired, multiple inlets, 60, 70, may be provided for the plasma gas 80 and/or the working gas 90.

Figure 3:
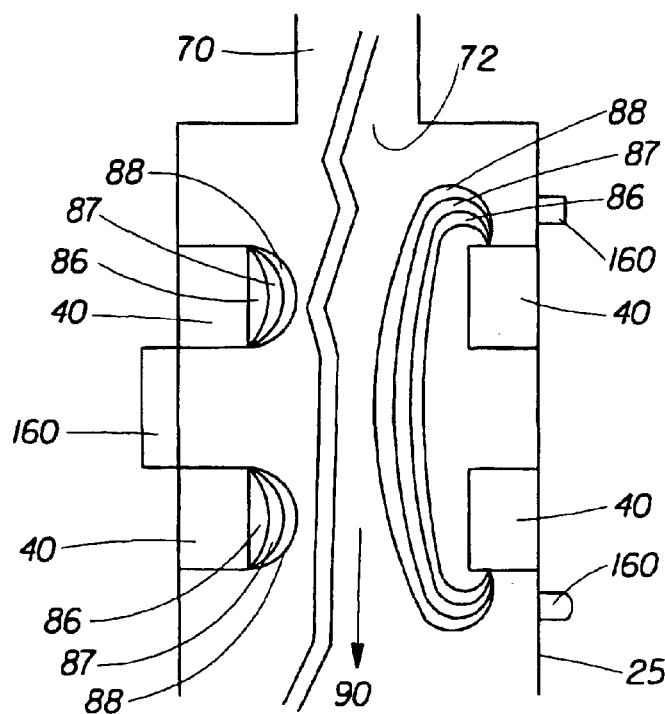
FIG. 3 is a broken schematic vertical sectional view of an alternative embodiment having a plasma concentrator in the form of plural rings, showing a single optional attenuator on the left side of the figure and dual plasma zones and a single plasma zone with dual attenuators on the right side of the figure.

Referring to FIG. 3, if desired, the plasma concentrator 40 may be in the form of one or more annular rings. A single hollow or annular ring may be provided internal to the chamber 20 and preferably internal to the quartz tube 25. Preferably the interior of the chamber 20 or tube 25 is circumjacent such a plasma concentrator 40. This geometry allows working gas 90 to flow axially through the center of the plasma concentrator 40. This arrangement will have a plasma core 86 internal to and which preferably inscribes the plasma concentrator 40. The inner plasma zone 87 is internal to and preferably inscribes the plasma core 86. The outer plasma zone 88, in turn, is internal to and preferably inscribes the inner plasma zone 88. Depending on the inside diameter of the ring geometry and the power level provided by the microwave power source 50, the outer plasma zone 88 may bridge the entire span across the inner plasma zone 87, or may have an annular hole therethrough. In either configuration, working gas 90 flows through such annular hole or through the outer plasma zone 88, without deleterious effects or interaction due to the thermal effects of the plasma, particularly the plasma core 86.

If desired, a second hollow plasma concentrator 40 may be provided and disposed axially of the first hollow plasma concentrator 40. Additionally, a microwave attenuator 160 may be provided between the first and second plasma concentrators 40. The attenuator 160 prevents the undue interaction of the working gas with the microwave. Attenuation may range from 1% to 100%. The attenuator may be made from a combination of materials such as fused silica, sintered boron nitride and various forms of aluminum oxide such as sapphire. Additionally, transparent windows 30 may be sized and disposed coincident each of the plasma concentrators 40. This arrangement prophetically provides the benefit that the plasma will be more axially distributed and less dense. Thus, the working gas 90 will prophetically encounter fewer deleterious effects due to concentrated plasma temperature.

If desired, multiple attenuators 160 may be used, as illustrated in the right half of FIG. 3. Either or both of the attenuators 160 may be disposed outboard of the plasma concentrators 40. This geometry provides attenuators 160 which are not intermediate the plasma concentrators 40, and thereby preventing plasma from forming on the walls of tube 25. Any of the attenuators described herein may be external to tube 25 as shown, or may be internal to tube 25, as known to one of ordinary skill, or may be disposed in internal/external combinations if so desired. Of course, if multiple plasma concentrators 40 and multiple attenuators 160 are used, there need not be a one-to-one correspondence between the attenuators 160 and plasma concentrators 40. There may be plasma concentrators 40 with zero, one, or more attenuators 160.

One or more of the plasma concentrators 40 may have a manifold to provide working gas 90 to the chamber 20. This working gas 90 may be the same as, different from or replace the working gas 90 otherwise supplied to the chamber 20. The manifold any have a plurality of inlet orifices 72 disposed axially, radially, circumferentially or in combinations thereof. Additional plasma concentrators 40 may be provided, as desired. The hollow plasma concentrators 40 may have the same or different inside diameters, outside diameters, and axial lengths.

Referring to FIGS. 2–3 it is apparent that any flow pattern, even eccentric, nonuniform and irregular flow patterns of the plasma gas 80 and working gas 90 may be utilized. It is simply desirable that the working gas 90 be excited by and flow past the generated plasma without deleterious interaction therewith or undue degradation due to the plasma. Of course, it is typically desired that the active species have a reasonably predictable and uniform pattern so that the treatment of the workpiece is as uniform as possible.

EXAMPLE 1

An apparatus 10 identical to the aforementioned MKS/Astex system was provided. Per the manufacturer's directions, Argon plasma gas, 80, was used at the lowest recommended flow rate (14.2 slm) and 500 Watts microwave forward power. The temperatures of the gas containing excited species exiting the chamber were measured at the distances specified in Table 1. The experiment was repeated substituting Helium for Argon as the plasma gas 80 and, significantly, using a flow rate of 3.02 SLM. The results show a drop in the temperature range from 178–370 C for the manufacturer's conditions, to a temperature range of 56–150 C at the lower flow rate. Thus, when the appatatus 10 is operated according to the prior art, the temperature range is too high to treat many common workpieces, 1, such as cotton fabrics. However, when operated in accordance with the present invention, a temperature range suitable for many common workpieces 1 will advantageously result.

Table 1 shows that suitable plasma temperature cannot be achieved using Argon plasma gas excited at a range of power levels from about 100 to about 500 Watts. Helium plasma gas, was too hot at a 500 Watt power level, but adequate at a power level of about 100 to 200 Watts and a flow rate of 3.02 SLM.

TABLE 1

| Plasma Gas | Plasma Gas Flow rate (SLM) | Input MW Power (Watts) | Distance from Distal end of Plasma Concentrator to Sample (cm) | Temperature (Degrees Celcius) |
|---|---|---|---|---|
| Argon | 14.2 | 500 | 10.5 | 370 |
| Argon | 14.2 | 500 | 13.0 | Temperature not recorded. Fabric burned. |
| Argon | 14.2 | 200 | 10.5 | 205 |
| Argon | 14.2 | 112 | 10.5 | 178 |
| Helium | 14.5 | 500 | 10.5 | 700+ |
| Helium | 14.5 | 200 | 10.5 | 335 |
| Helium | 14.5 | 112 | 10.5 | 275 |
| Helium | 3.02 | 500 | 10.5 | 150 |
| Helium | 3.02 | 500 | 14.3 | 50 |
| Helium | 3.02 | 200 | 10.5 | 78 |
| Helium | 3.02 | 200 | 14.3 | 38 |
| Helium | 3.02 | 112 | 10.5 | 56 |
| Helium | 3.02 | 112 | 14.3 | 30 |

EXAMPLE 2

The apparatus of example 1 was used. The plasma gas 80 was Helium. The working gas 90 was perfluormethylcyclohexane (PFMCH) monomer with a carrier gas Argon. In the control experiment, the working gas 90 was introduced to the plasma through a coaxial hole in the ceramic plasma concentrator 40, such that the working gas 90 entered the plasma at the plasma core 86. In the trial the working gas 90 was introduced in a downstream position indicated in Table 2, such that the working gas was believed to be preferentially exposed to the either the outer plasma zone 88 or to excited plasma gas 80 species further downstream thereof. In each case, a piece of 100% cotton fabric was positioned below the outlet 22 in the position indicated in Table 2, such that the working gas 80 and plasma gas 90 impinged on the fabric surface 1 for treatment of the surface 1.

At the end of each trial, the fabric was analyzed for hydrophobicity by placing a water drop on the fabric. Untreated 100% cotton fabric absorbs water readily and has a water contact angle of less than 10 degrees. It was visually noted that the water drop on the treated fabrics beaded up, with a water contact angle greater than about 130 degrees, indicating a hydrophobic surface 1 modification had occurred. Additionally, the fabric was analyzed using X-ray photoelectron spectroscopy (XPS) to determine the presence of elemental Fluorine and polymeric fluorocarbons. In the control, fluorine was observed but no CF2 or CF3 groups were observed, indicating that the PFMCH monomer had disintegrated in the process and only fluorine was incorporated into the fabric surface 1 to give rise to hydrophobicity. In the trial run, presence of CF2 and CF3 groups on the surface 1, along with the Fluorine, indicated that a fluorocarbon polymeric coating had formed on the surface 1 of the fabric sample. This fluorocarbon polymeric coating is advantageously durable, hydrophobic and relatively continuous.

contain a CF3 group attached to a chain of CF2 groups, giving a plasma polymer coating with a CF2/CF3 ratio greater than 1 and preferably greater than 5. Such coatings can be obtained when the working gas 90 has a starting monomer with similar a CF2/CF3 ratio and plasma conditions are adjusted such that the monomer structure is not unduly disrupted through monomer disintegration or other degradation, and the structure of the starting monomer is retained in the plasma polymer coating. The working gas 90 used in Example 4 had a CF2/CF3 ratio of 5. In Sample 2, at the higher MW input power, the ratio of CF2/CF3 in the

TABLE 2

| Sample position below distal end concentrator | MW Power (Watts) | Treatment Time (min) | Working Gas Inlet Orifice Position (relative to distal end of concentrator) | He Plasma Gas flow rate (SLM) | Ar Working Gas carrier flow rate (SLM) | F | $CF_2$ (Percent) | $CF_3$ |
|---|---|---|---|---|---|---|---|---|
| 18.1 cm | 112 | 5 | Coincident | 3 | 1 | 19.7 | NA | NA |
| 20.9 cm | 200 | 25 | 12.5 cm below | 3 | 1.4 | 37.9 | 3.0 | 9.3 |

EXAMPLE 3

In a third experiment, the foregoing apparatus 10 was reused and the setup was adjusted as described below. A fabric sample was placed 16 cm from the distal end 46 of the plasma concentrator 40. The plasma gas 80 was Helium and the working gas 90 was PFMCH. The working gas 90 was used with a carrier gas of Helium. The working gas 90 was introduced 3.5 cm downstream of the distal end 46 of the plasma concentrator 40. The treatment time was held constant at 10 minutes and the microwave power varied. The results, shown in Table 3 below, illustrate that the percentage of Fluorine on the sample surface 1 are directly proportional to the MW input power used, throughout the selected power range.

TABLE 3

| Trial | Power (W) | Fluorine (percent) |
|---|---|---|
| 1 | 190 | 3.4 |
| 2 | 200 | 12.5 |
| 3 | 220 | 19.4 |
| 4 | 230 | 34.4 |

EXAMPLE 4

In a fourth experiment, the apparatus 10 and setup from Example 3 were reused. Both the microwave power and treatment time were varied. After treatment, the fabric samples were analyzed by XPS to determine the relative concentrations of Oxygen, Carbon, Fluorine, CF2 and CF3 groups The results are shown in Table 4 below. Compared to the control, which contained relatively high levels of oxygen from the cellulose fibers, the reduction of Oxygen content in Samples 1 and 2, is due to the coverage of the cotton surface with a fluorocarbon polymer coating that does not contain Oxygen.

Due to the different CF2/CF3 ratios at constant Fluorine content, it is believed that the lower power rather than the longer treatment time is responsible for the improved CF2 percentage in Sample 1. In the formation of fluorocarbon plasma polymer coatings to achieve hydrophobic modification of surfaces, the most desirable coatings are those that polymer coating was about 0.7. In Sample 1, at the lower MW input power, this ratio increases to about 1.2, providing a fluorocarbon polymer coating with better performance.

TABLE 4

| Sample | Power (W) | Treatment Time (min) | F (percent) | CF2 (percent) | CF3 (percent) | O (percent) |
|---|---|---|---|---|---|---|
| Control | 0 | 0 | 53 | — | — | 47.0 |
| 1 | 190 | 12 | 63.2 | 11.1 | 8.7 | 8.7 |
| 2 | 250 | 4 | 63.4 | 6.1 | 8.8 | 8.1 |

What is claimed is:

1. A method of plasma treating a surface of a workpiece at atmospheric pressure, said method comprising the steps of:

providing a plasma generating apparatus comprising a chamber for containing a plasma, a first inlet having a first inlet orifice for admitting a plasma gas into said chamber, a second inlet having a second inlet orifice for admitting a working gas into said chamber, plural plasma concentrators spaced apart from one another and being disposed in said chamber for varying the density of the plasma within said chamber, an outlet from said chamber allowing a gaseous species to exit said chamber, and a microwave power supply for providing microwave radiation to said chamber and generating plasma from said plasma gas, whereby said plasma excites said working gas to create an excited species which exits said outlet to treat the surface;

supplying plasma gas through said first inlet and into said chamber;

providing microwave radiation from said microwave power supply to said plasma gas;

generating a plasma from the plasma gas using said microwave radiation, the plasma being concentrated near the plasma concentrators;

supplying working gas through said second inlet to said chamber, wherein said working gas bypasses said first inlet orifice;

exciting said working gas using the plasma to create an excited gaseous species;

juxtaposing said outlet with the workpiece to treat a surface of the workpiece; and applying a treatment of the excited species to the surface of the workpiece at approximately atmospheric pressure.

2. A method according to claim 1 wherein said plasma is generated at atmospheric pressure.

3. A method according to claim 1, further comprising the step of moving said apparatus about said workpiece, thereby treating different portions of said surface of said workpiece.

4. A method according to claim 2, wherein said step of supplying said plasma gas comprises the step of supplying an inert gas.

5. A method according to claim 1 further comprising the step of providing an inlet in each of said plasma concentrators and supplying a working gas through each said inlet in each said plasma concentrator.

6. A method according to claim 5 wherein said step of providing plural plasma concentrators comprises the step of providing plural plasma concentrators having an annular shape, and disposing said plasma internal to said plasma concentrators.

7. A method according to claim 1, wherein said plasma is generated at a pressure from about 200 Torr to about 2,500 Torr.

* * * * *